Figure 1:
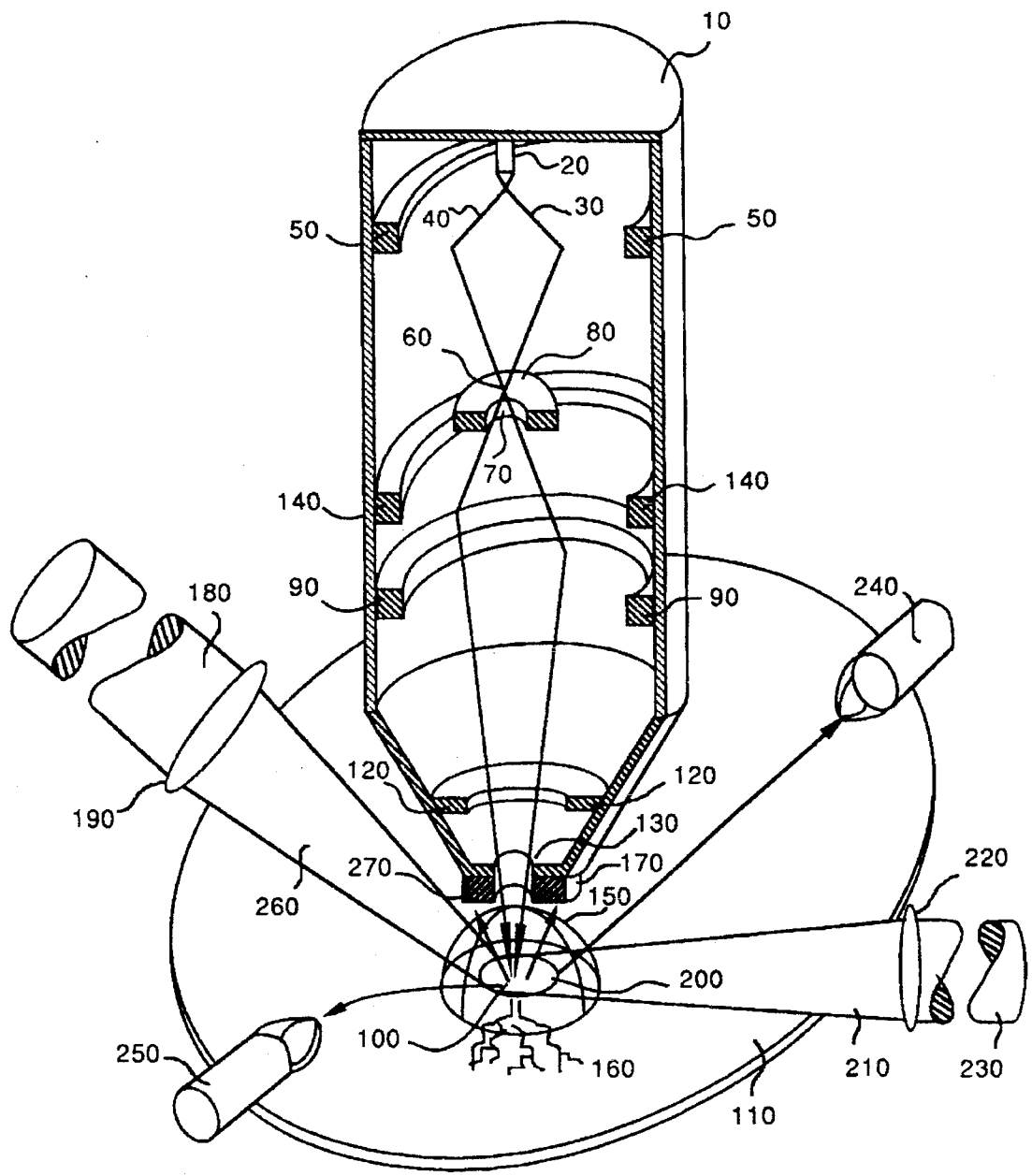

United States Patent [19]
Shahar et al.

[11] Patent Number: 5,591,971
[45] Date of Patent: Jan. 7, 1997

[54] SHIELDING DEVICE FOR IMPROVING MEASUREMENT ACCURACY AND SPEED IN SCANNING ELECTRON MICROSCOPY

[76] Inventors: Arie Shahar; Nira Schwartz; Richard W. Woods, all of 2800-187 Plaza Del Amo, Torrance, Calif. 90503

[21] Appl. No.: 529,675

[22] Filed: Sep. 18, 1995

[51] Int. Cl.$^6$ .......................... H01J 37/256; H01J 37/28; G01N 23/225
[52] U.S. Cl. ............................................. 250/310; 250/307
[58] Field of Search ...................................... 250/310, 307

[56] References Cited

U.S. PATENT DOCUMENTS

| | | | |
|---|---|---|---|
| 5,298,976 | 5/1994 | Shahar et al. | 356/375 |
| 5,311,288 | 5/1994 | Shahar | 356/375 |
| 5,448,064 | 9/1995 | Matsuyama | 250/310 |

OTHER PUBLICATIONS

Flemming et al., Review of Scientific Instruments, vol. 42, No. 10, Oct. 1971, pp. 1495–1501.

*Primary Examiner*—Jack I. Berman
*Attorney, Agent, or Firm*—David Pressman

[57] ABSTRACT

An electrically conductive, shielding mesh structure (320) is interposed between a scanning electron microscope (10) and a sample (110) being examined. This shield prevent electrical field (325) leakage from the microscope from reaching the sample (110) where it would otherwise interact with various sample compositions or structures unpredictably, causing uncertainty in the working and focal distances. The mesh (320) can be electrically biased and electrical field gradients can be introduced by applying different voltages to different wires (360, 510) in the mesh. Alternatively, the mesh (320) can operate magnetically and adjustable magnetic and electric fields and fields gradients can be utilized to maximize collection efficiency and minimize distortion of scanned image. The absence of the perturbing leakage field (325) at the sample enables the use of an optical autofocus system (630, 640, 690, 700, 730, and 750), resulting in a high sample throughput rate. The components which comprise the autofocus system are symmetrically arranged to prevent astigmatic distortion of the electron beam. These components can be electrically biased, thus enhancing efficiency of the microscope's x-ray and electron detectors (170, 240, and 250).

51 Claims, 4 Drawing Sheets

FIG 1 -- Prior Art

SHIELDING DEVICE FOR IMPROVING MEASUREMENT ACCURACY AND SPEED IN SCANNING ELECTRON MICROSCOPY

BACKGROUND

1. Field of Invention

This invention relates to electron microscopes, particularly to the fields of scanning and critical dimension-scanning electron microscopy, auto focus systems, and electromagnetic screening.

2. Prior Art

A scanning electron microscope (SEM) subjects a sample being studied to a very freely focused beam of electrons. The SEM causes the beam to scan back and forth over the sample in a two-dimensional pattern or raster. Some electrons are scattered from the sample as the beam traverses it, a process which is known as back scattering. X-rays are also emitted as the impinging electrons are abruptly stopped by striking the sample. These scattering and emission mechanisms are well understood by those familiar with the interactions between electrons and matter. In a SEM the scattered and emitted electrons and X-rays are collected by suitable detectors. The outputs of these detectors are combined to provide a signal representative of the topography of the sample or its structure. This signal can be displayed, stored, and analyzed.

The operation of the a SEM can be automated. Automated SEMs are used in the unattended inspection of objects, such as semiconductor wafers. These wafers generally contain various fiducial markers for the purpose of locating certain structures, such as elements of electronic circuitry, test objects, and the like which are contained in a wafer. Once located, a given circuit or other feature can be inspected for defects in its structure. The defects are noted for later reference.

One measurement in common use in semiconductor manufacturing is called the "Critical Dimension" (CD) measurement. When this measurement is made using a SEM, it is generally referred to as a SEM-CD measurement. Certain dimensions of semiconductor structures must be correct so that devices made from these structures will function properly. That is why these are called "critical dimensions". SEM-CD measurements are normally done on "test targets". These are specially designed structures included on the wafer for test purposes only. If the test targets are the correct size and shape, it follows that other semiconductor devices in their proximity will also have the correct size and shape and will therefore function properly.

Competitive pressures in the semiconductor industry require manufacturers to achieve maximum throughput rates in their production lines. Thus the SEM-CD measurement must be automated, accurate, and fast. The required resolution of the scanned image is typically ±5 nanometers. Generally between 5 and 10 target locations on each semiconductor wafer are surveyed in this way. Measurements must be performed at a rates in excess of 25 wafers per hour, or between 125 and 250 targets per hour, allowing between 14 and 28 seconds per target.

Automating these measurements requires that the working distance (WD) and focal length (FL) of the SEM be accurately known. The WD is the distance between the end of the SEM nearest the sample and the sample itself. The FL of the SEM is the distance from the plane of the objective lens of the SEM to the plane where the electron beam is focused to its smallest point. The WD is generally adjusted up and down automatically. The FL is electrically adjusted, but over a smaller distance than the WD.

The WD is set as follows:

a) a high-quality image of the sample surface is acquired, b) the spatial frequency spectrum of this image is automatically analyzed, c) the WD is repeatedly adjusted up and down to provide the highest spatial frequency values in the image, which represent the best focus, and d) when the spatial frequency maximum is found, the process stops and the final data are recorded.

These steps are repeated as many as 5 to 6 times, in a total elapsed time of 7 to 10 seconds. The procedure is repeated for each target on the sample wafer.

SEM-CD measurements frequently relate to pattern surfaces with dielectric or insulating material layers. These materials are charged by the electron beam of the SEM. The charge which accumulates on these materials creates a local electric field which perturbs the electron beam, causing an out-of-focus and distorted image. The length of time required to establish the optimal WD is critical. Shortening the time over which this measurement takes place improves throughput and reduces the amount of charge deposited on these insulating materials, thus resulting in improved measurement accuracy. However, speeding up measurements results in poor signal-to-noise ratio (SNR) in the detector's signals, thus degrading the accuracy of the measurement. The higher the SNR, the finer the quality of the image available for analysis, and consequently the better the adjustment of WD. This conflict between the need for a high SNR which requires longer measurement time, and charging of the sample which requires shorter measurement times results in a measurement which compromises both goals.

The above disadvantages lead to the use of alternative techniques to establish the optimal WD. One of the most attractive techniques is the optical auto-focus system. Establishing the optimal WD with the use of optical sensors or devices is known as "optical measurement" to distinguish from the SEM-CD measurement, described supra, which uses an electron beam. The optical measurement is used to establish the WD, and the SEM is used only for the CD measurement. The two measurements are performed on a common region. This results in a faster determination of WD and shorter exposure of the test target to electron beam.

The WD is relatively small compared to the dimensions of the polepiece of the microscope. Therefore it is necessary to use a triangulation technique for the optical auto-focus. The use of optical triangulation on a patterned surface causes non-uniform scattering, non-uniform absorption, non-uniform reflections, interference, and phase shift of the reflected light. These affect the measurement accuracy and introduce a measurement error known as "drawback" error. "Drawback" is an error in the WD measurement resulting from surface irregularities on the sample. For example, a SEM with a depth of focus of 0.5 micrometer can perform a CD measurement with the required 5-nanometer resolution. However this implies that the measurement for determining the optimal WD must be accurate to within less than ±5 micrometer. Because of the drawback error, the use of a simple optical triangulation technique does not result in the required accuracy.

Several techniques have been developed to overcome the "drawback" error. The two most effective techniques are described in U.S. Pat. No. 5,298,976 to A. Shahar et al. (1994) and U.S. Pat. No. 5,311,288 to A. Shahar (1994). The '976 patent U.S. Pat. No. 5,298,976 relates to a triangulation technique and adds numerous features to CD measurements from patterned surfaces, such as:

a) stability (measurement values are free from errors caused by mechanical vibration), b) high measurement accuracy, c) high speed measurement, d) absolute distance measurement (other triangulation techniques only indicate deviations from a reference plane without supplying the magnitude of the deviations), and e) freedom from the requirements for nulling procedure (other triangulation techniques require a time consuming nulling procedure).

A fully automated SEM-CD is primarily used for quality and process control in the semiconductor industry where multiple chips are fabricated on a large silicon wafer. This application requires:

a) high throughput, b) high resolution, c) a low current electron beam (to prevent surface charging), and d) a low accelerating voltage (to preventing damage to the wafer through bombardment with high energy electrons).

Requirement (d) above, for a low accelerating voltage, combined with the need for high resolution, prevents the simple integration of an optical auto-focus system with the SEM-CD.

DRAWING FIGS

FIG. 1 schematically illustrates a cross section of a prior-art electron microscope system with an integrated optical auto focus system in the process of measuring a sample.

Figure 2:
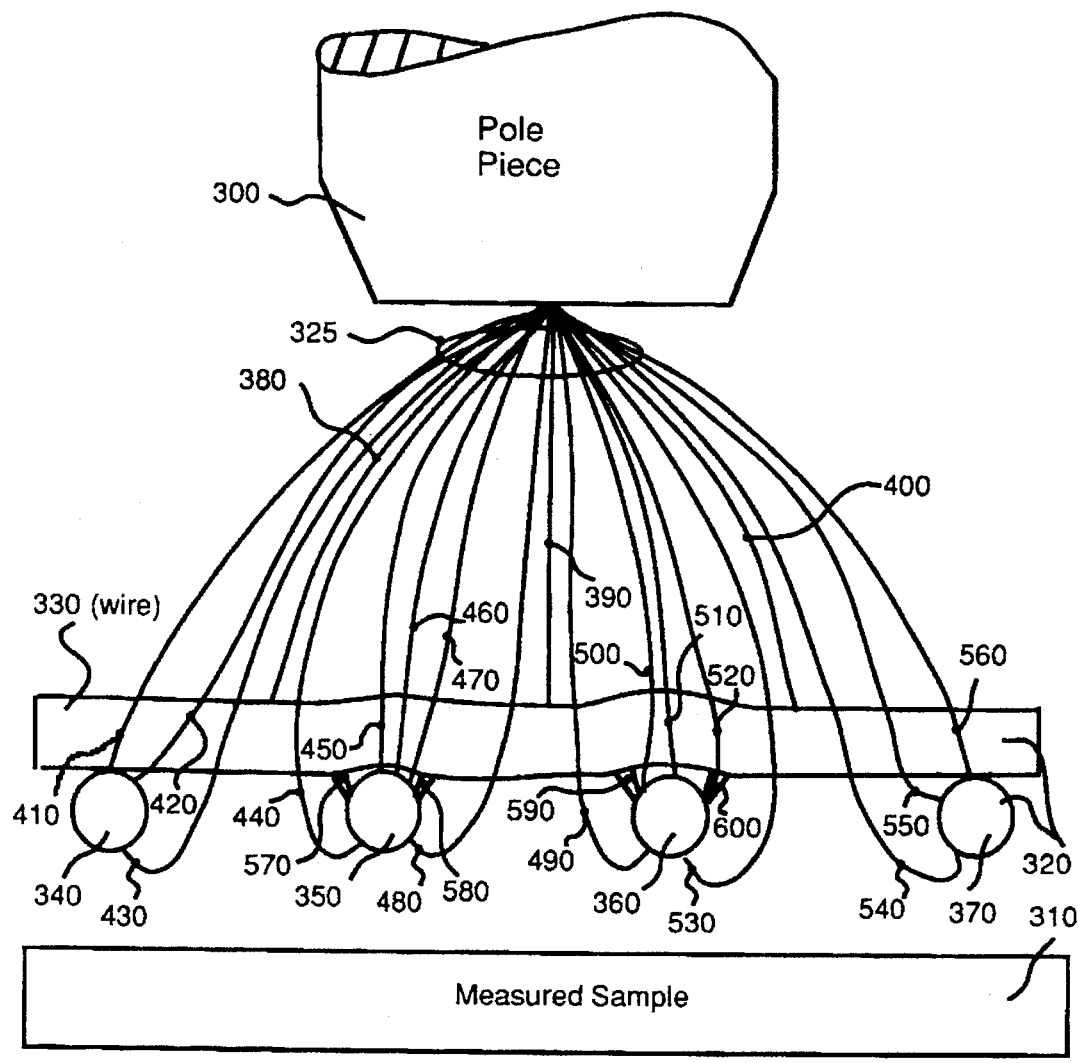

FIG. 2 shows the present system for shielding a measured sample from leaking electric fields by mounting a conductive mesh between the sample and the SEM's pole-piece.

Figure 3:
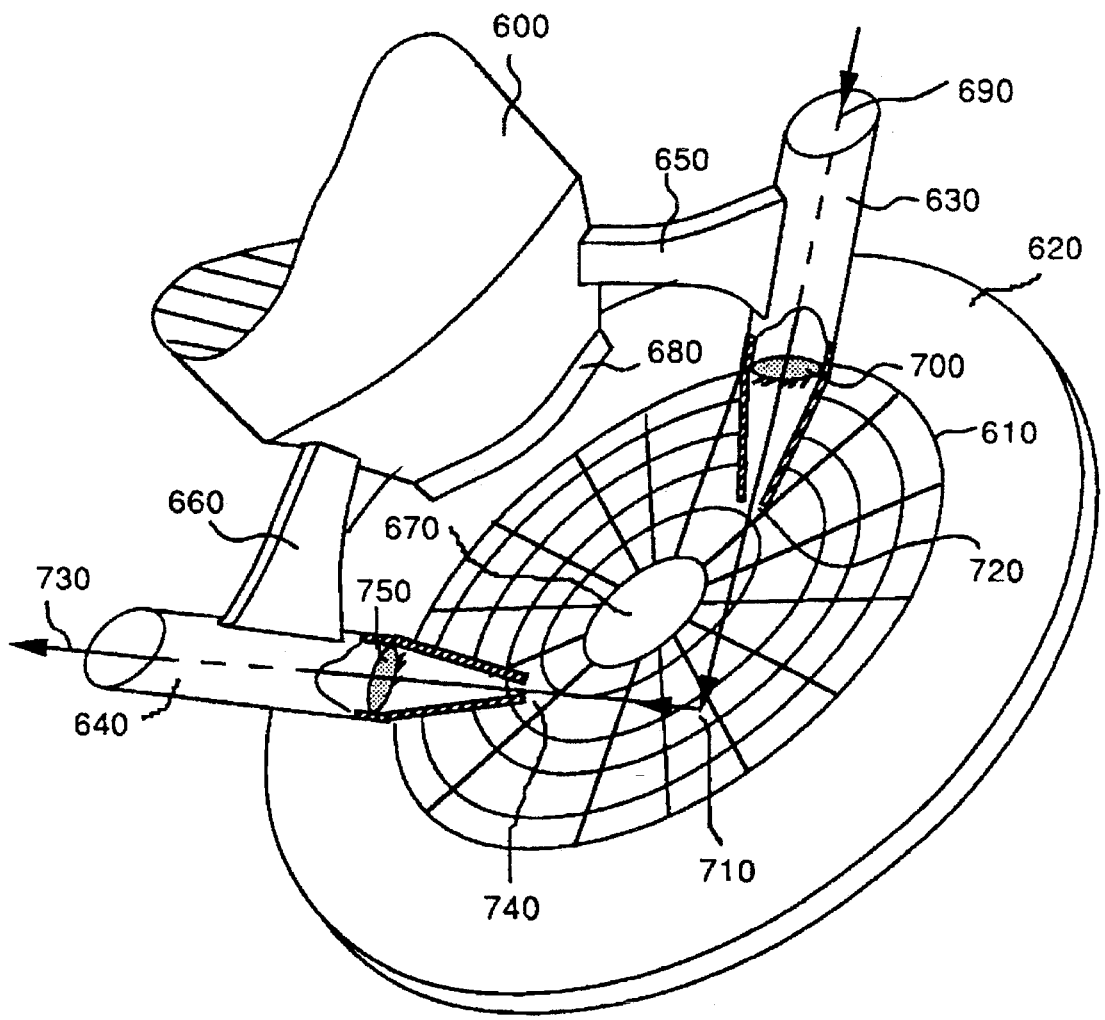

FIG. 3 schematically illustrates the positioning of the conductive mesh for screening the leakage field.

Figure 4:
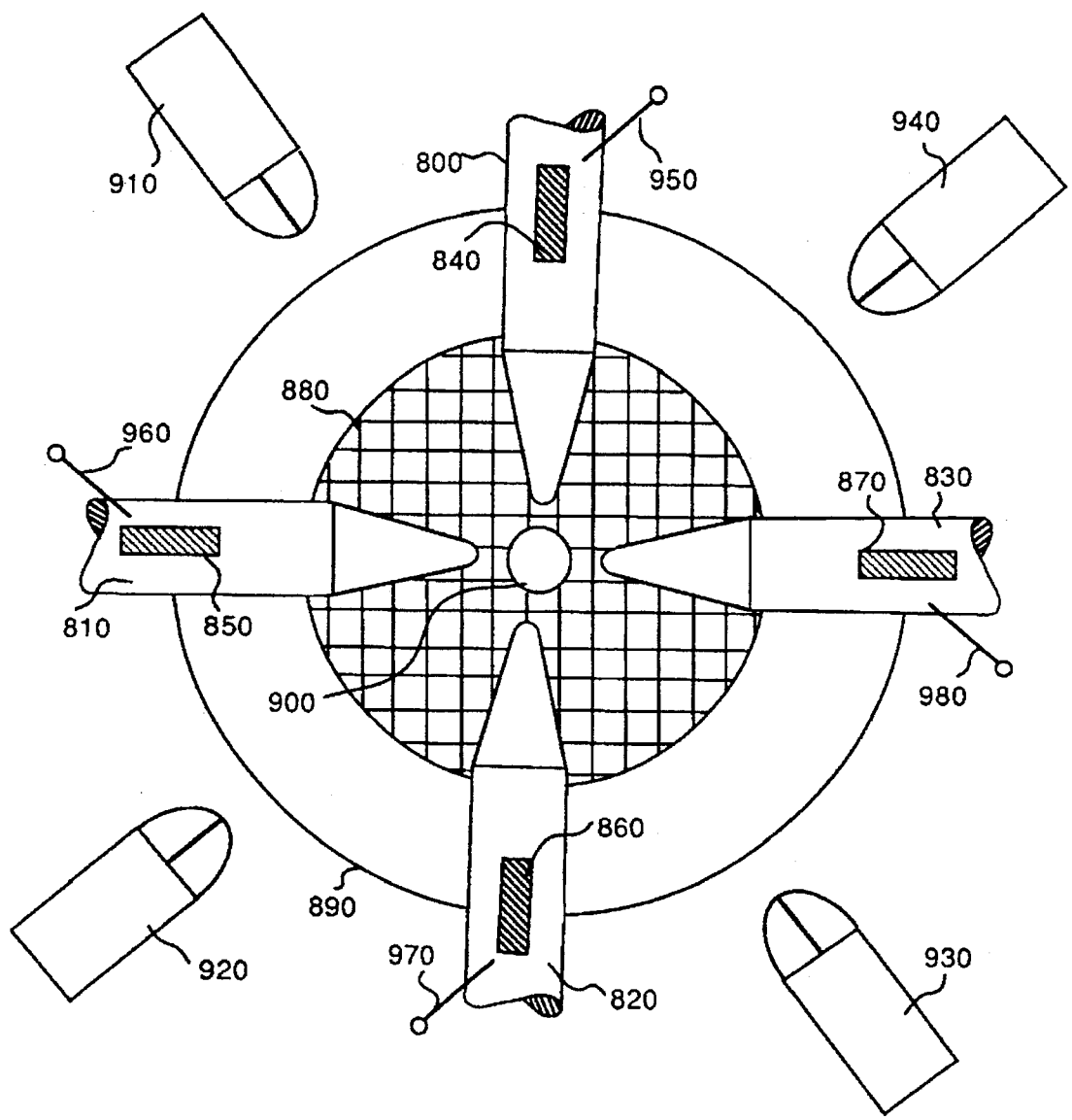

FIG. 4 shows a top view of a cross section of a system similar to the one illustrated in FIG. 3.

Abbreviations

CD Critical Dimension

E electron energy

Ep parallel electric field

ETD Everton Thorenly detectors

Ev normal electric field

FL focal length

Hv field component

I objective lens current

Key thousand electron volts m magnetic permeability

MCP multi-channel plate

MCP multi-channel plate

S distance (objective lens to polepiece edge)

SEM scanning electron microscope

SNR signal-to-noise ratio

WD working distance

ΔE change in E

FIG. 1—ELECTRON BEAM MICROSCOPE INTEGRATED WITH AUTO-FOCUS SYSTEM—PRIOR ART—THE SCANNING ELECTRON MICROSCOPE

FIG. 1 shows a schematic drawing of a prior-art electron-beam microscope with an integrated auto-focus system. The microscope of FIG. 1 achieves the requirement, described above, for low current and low acceleration voltage with high resolution. FIG. 1 also demonstrates the electron beam microscope's principle of operation. The difficulties and problems encountered by integrating such a microscope with an auto-focus system are explained infra. A microscope of this type is sold by ICT Corporation, located in Germany.

The electron beam microscope is housed in a column 10, which is typically 10 cm in diameter and 30 cm in height. Column 10 contains a tip 20 from which electrons are emitted, either by a thermal process, a cold field process, or a combination of the two. All emitted electrons are accelerated by an applied electric field to an energy range typically between 1 and 50 thousand electron volts (Kev). All working components of the SEM are enclosed in an evacuated space and include a table and various other well-known components (not shown).

The emitted electrons travel within the region determined by paths 30 and 40 and are directed by condenser electrode 50 toward crossing point 60, above the center of aperture 80. Only electrons directed toward exit 70, located at the center of aperture 80, continue in their trajectory. The remainder are absorbed by the aperture. Thus condenser electrode 50 modulates the electron beam current, which is typically a few picoamperes. Depending on their construction, condenser 50, scanner 140, and objective lens 90 can act on the beam electrons through the influence of either electronic or magnetic fields. For simplicity in the present discussion they are called "electrodes".

Electrons that pass through exit 70 travel toward objective lens 90, which focuses them into a very small spot 100, typically 10 nanometers in diameter, located on sample 110. While traveling toward sample 110, the electrons pass through "stopper" electrode 120 which produces a retarding field known as a "stopping field" and reduces their high energy to a lower energy range, typically between 1 and 5 Kev. This is done to prevent the electrons from damaging the sample. Scanner assembly 140 provides lateral electron beam movement for scanning the measured sample. Astigmatic distortion of the electron beam can be prevented if column 10 and all of the inside components are shaped in cylindrical symmetry around the axis of the column.

Column 10 is made from conductive material and is shielded to prevent radiation (leakage) of electromagnetic fields. Only one exit 130 allows the electron beam to leave the column and reach sample 110. At this location the exit diameter, typically 5 mm, is much larger than the electrons beam's diameter, which is typically 30 nanometers. This allows movement of the electron beam as it is deflected by scanner 140 to traverse sample 110.

Stopper 120 is located near focused spot 100, where the electron beam's diameter is small and far away from objective lens 90. In this physical configuration the disturbing influence of the stopping field on the focusing spot is constant and can be corrected by changing the parameters of the objective lens. However, the close proximity of stopper 120 to exit 130 enables a significant fraction of its field 150 to leak out of column 10 and reach sample 110 with a significant intensity. Because of charging effects, differences in conductivity, and the like, the type of sample measured further contributes unpredictably to the leakage field's intensity and the two fields strongly influence the focusing process.

The electrons which impinge upon sample 110 dissipate their energy in a number of ways. Some are reflected back in a process called back scattering and some are absorbed in the sample where they produce heat and X-rays. Secondary emission, called Auger emission, has the greatest probability of occurrence when the electron beam energy is in the range of 1 to 5 Kev. In this process, the primary electrons from the beam penetrate sample 110 along arbitrary path 160 and cause a fraction of the sample's electrons to be scattered out of the sample, away from the vicinity where the electron beam strikes the sample.

Emitted electrons or X-rays that leave sample 110 in a direction nearly parallel to the axis of symmetry of column 10 are collected by detector 170, called a multi-channel plate (MCP) detector. Electrons or X-rays which are emitted at shallow angles are collected by Everton Thorenly detectors (ETD) 240 and 250.

The autofocus system, in conjunction with the SEM light beams 180, 210, 230, and 260, and lenses 190 and 220, comprise an optical auto-focus system (its other components are not shown). Lens 190 focuses a collimated light beam 180 into beam 260 with focused spot 200 on sample 110. This beam is reflected as beam 210, which is collected and converted by lens 220 into parallel beam 230 for subsequent detection. This system is designed to assure and adjust the location of sample 110 to be at the optimal WD from the bottom edge, also known as the polepiece, of column 10.

The resolution of an electron microscope is determined by the size of the electron beam's focal spot 100. A smaller spot produces an image with higher resolution. Several factors act to increase the spot size. These include chromatic and spherical aberrations, astigmatism, and parallax distortion. The increase in size of spot 100 is primarily due to chromatic aberration caused by the energy distribution of the emitted electrons with energy range ΔE, where E indicates the electron energy, typically between 1 and 50 Key. Smaller values of ΔE/E reduce this aberration contribution and can be achieved by using high accelerating voltage that creates large values of E.

Lens 90 and stopper 120 do not perturb the focus of the electron beam. Focusing is done by objective lens 90 where the electrons are highly energetic with a small value of ΔE/E, resulting in a very small focusing point, typically 10 nanometers in diameter, and a high resolution measurement. Stopper electrode 120 is located away from objective lens 90, and is therefore able to reduce the electrons' energy to the range of 1 to 5 Kev, without focus spot perturbation. Thus two of the previously stated requirements, i.e., high resolution and low energy level, are satisfied simultaneously.

The leakage of electrical (or magnetic field) 150 escaping from column 10 through exit 130 and reaching sample 110 is the principal disadvantage of this configuration. The field's shape and intensity are strongly affected by the sample material type (e.g., insulator, conductor or dielectric), by the sample shape and by the location of the measured target on the sample. Therefore the shape and intensity of field 150 strongly affect the WD In this configuration the use of an optical auto-focus system is not practical since its use assumes a fixed WD, while the SEM's working distance varies and depends on the characteristic of the measured sample.

The measurement accuracy of the SEM strongly depends upon its electron beam resolution, (i.e., the smaller the diameter of the beam at the sample the better the accuracy). The best resolution is achieved when the WD equals to the difference between the FL of the SEM's objective and the distance of this objective from the edge of the polepiece. The SEM's WD is defined as:

$$WD = FL - S \tag{1}$$

where WD is the distance between the surface of sample 110 and the edge of polepiece 270, FL is the focal length of the SEM's objective lens, and S is the distance of the objective lens 130 from the edge of the polepiece. S is a constant parameter and its value is determined by the physical dimensions of the SEM. Satisfying equation (1) while S is a constant value can be done by adjusting WD or FL or both. Typical values for WD, FL and S are 8 mm, 40 mm, and 32 mm respectively.

The FL of lens 90 can be controlled and its value can be predicted with a high degree of accuracy, provided its field (either electronic or magnetic) is not distorted by external influences. The FL for either an electrostatic or a magnetic lens is defined as:

$$FL = F(I, V) \tag{2}$$

where I is the objective lens current (typically 500 milliamperes), when a magnetic lens is used. V is the objective lens voltage and is typically between 1 and 10 thousand volts (KV) when an electric lens is used. F is a function of I and V, "the predict and control function". Function F predicts and controls the FL value by controlling the values of I and V. Function F can be established by system calibration and makes it possible to predict and control the FL, provided the objective lens fields are undisturbed. With predictable values of FL, the use of an optical auto focus system can enable accurate adjustment of WD. In practice, the parametric values are corrected in iterations toward the desired accuracy through a "closed loop" adjustment procedure. This procedure is not described further here. It is well known to those skilled in the art of electron microscopy.

The value of FL cannot accurately be predicted in cases where the measured sample affects the leakage field, thus distorting the field of objective lens 90. In this case the control and prediction function F is no longer well known and is in general different for each sample. The result is unpredictable errors in the FL, resulting in inaccurate sample measurements.

Objects and Advantages

Accordingly several objects and advantages of the present invention are to provide an improved electron microscope, to improve measurement accuracy and speed for samples located in the vicinity of disturbing electric, magnetic, or electromagnetic leakage fields, to shield the electric, magnetic, or electromagnetic field that leaks from the electron microscope's column, to prevent this field from reaching the sample with a significant intensity, to permit the use of an optical auto-focus system, to provide a SEM design which will eliminate the random influence of the measured sample on the FL, to eliminate the dependency of the WD (working distance) and FL (focal point) on the sample composition and the location of the measured target on the sample, mainly when the measured target is located near the edge of the sample, to create the above-mentioned shielding without degrading the electron microscope's resolution, or introducing astigmatic distortions to the electron beam, and to achieve all the above objects in a configuration that allows the integration of an optical auto-focus system which can measure and accurately adjust the working distance.

Other objects and advantages are to shield a sample with toque mesh made of conductive materials or coated by a conductive material, to provide SEM with hollow tubes, specially built to create an optical path to and from the measured sample without affecting the microscope's performance, and to satisfy all of the above objects without a significant reduction in the collection efficiency of electrons by the multichannel plate detector that is mounted at the bottom of the microscope's column beneath the polepiece, or the Everton-Thorenly detector that is located on the sides of the column of the electron microscope.

Additional objects and advantages will become apparent from a consideration of the drawings and description thereof.

Summary

In accordance with the present invention, predictability and stability of the SEM's WD and FL are accomplished generally by interposing a shielding mesh or screen between the electron microscope's polepiece and the measured sample.

FIG. 2—SHIELDING MEASURED SAMPLE FROM LEAKAGE FIELD—PREFERRED EMBODIMENT—PRESENT SYSTEM—ELECTRICAL SHIELDING

In accordance with the invention, a measured sample in an electron microscope is shielded by the principal components shown in FIG. 2. These components comprise a conductive mesh between the polepiece of the SEM and the measured sample. Such an electrostatic component eliminates the unwanted influences of fluctuations in the leakage field on the optimal FL and improves the measured accuracy.

However shielding with a conductive mesh has never before been integrated into a SEM to improve the level of measurement accuracy. By eliminating the influence of the measured sample on the FL, the influence of measured sample on the WD is thus eliminated.

A polepiece 300 is located at the lower part of the SEM's column (not shown) and above a measured sample 310. A conductive mesh 320 is mounted in the space between the measured sample and the polepiece. An electric leakage field 325 is shown emerging through the electron beam's exit (not shown in FIG. 2 but labeled as 130 in FIG. 1) in polepiece 300. The diameter of the beam exit is much larger than the diameter of the electron beam passing through it. This assures enough room for beam movement while scanning the sample.

The leakage field distribution in space is shown by lines 380–560. Its intensity depends upon the beam's exit dimensions, the distance from beam's exit, the intensity of inner field sources (not shown) located inside of the column, the type of sample being measured and the system physical dimensions.

A prior-art electron microscope system (120 in FIG. 1) with a stopping field generated by a ring mounted dose to the exit is characterized by a significant intensity of leakage field 325. An electron microscope integrated with an optical autofocus system and with a stopping field, but which lacks a conductive mesh 320, is characterized by inaccurate sample measurement. This inaccuracy is a result of incorrectly predicting the FL of the SEM's objective lens. The optimal WD is adjusted and calibrated according to the FL, and the FL is strongly influenced by the intensity and space distribution parameters of the leaking field as a function of sample 310. These parameters vary with different samples. The WD varies with each new sample and introduces inaccuracy to the measurement.

The present electron microscope includes conductive mesh 320 and is characterized by a significant improvement of sample measurement accuracy. The leakage field's parameter values are invariant with different types of samples, keeping the optimal working distance free of the sample influence.

The electric field equals zero in a conductive material and is therefore equal to zero in conductive mesh 320. It is not equal to zero outside the mesh. Electric field E (not shown) can mathematically be expressed as two independent field components. The first electric field component Ep (not shown), is parallel to the conductive mesh surface, and the second one Ev (not shown) is normal to the conductive mesh surface.

The electric field component parallel to surface of a material features a continuous value through the boundary surface. Therefore Ep has a continuous value through the boundary surface between mesh 320 and its surroundings and since it equals zero inside the mesh must therefor equal zero on the mesh boundary. In this situation it is clear that the electric field has only a vertical component Ev, normal to the surface of the conductive mesh. Based on this fact, the electric field in the vicinity of the mesh is as shown in detail in this figure.

Mesh 320 is shown in cross section. Wire 330 is parallel to the plane of the paper. Wires 340, 350, 360, and 370 are normal to the plane of the paper. The spacing between the wires is large enough to allow the electron trajectories to reach the detectors and is small enough to shield the sample from the leakage field. Field lines 380, 390, and 400 arrive at wire 330 and are normal to it. Field lines 410–560 pass through the space between wires 340–370 and bend in order to reach the wires' surfaces vertically.

The electric field's intensity beneath mesh 320 decays rapidly. The decay distance (not shown) is defined as the vertical distance below the conductive mesh where the electric field intensity decays to a negligible value. Major parameters which contribute to the extent of the decay are the leakage field's intensity and the physical dimensions of the mesh, such as the space between the wires of mesh 320. Placing sample 310 at the proper decay distance will create the shielding effect, resulting in a fixed WD for the SEM. Smaller wire spacing results in a smaller decay distance will reduce the system dimensions. However smaller wire spacing will affect the detectors' collection efficiency for electrons emitted from the sample, since a large fraction of them will hit and be collected by the mesh. The decaying distance is also a function of the leakage field intensity.

Electrical Shield—Different Potentials Applied to Mesh Wires

Mesh 320 has a unique structure which increases the detectors' collecting efficiency. Supplying multiple voltages to the mesh in addition to structurally modifying the mesh can alter the electric field to provide an electric potential gradient oriented towards the detectors.

In the first embodiment a mesh has all wires in electrical contact and at the same potential. This mesh is modified so that certain wires are insulated from other wires and the two sets of wires are held at different potentials. Mesh wire isolation is provided by insulating spacers such as spacers 570–600 that create space between wires 350 to 360 and wire 330. Sample 310 affects the potential under mesh 320, while above the mesh its influence is negligible. This modified mesh creates a modified field that directs emitted electrons from sample 310 towards the SEM's detectors.

Applying a small voltage, approximately 10 volts, on certain of the mesh wires produces potential gradient that helps the low energy emitted electrons from the sample reach the detectors and improve collecting efficiency without affecting the primary beam, which is much more energetic. This can be done while still maintaining the sample shielding from the leakage field and therefore maintaining a fixed working distance.

Whether or not voltage is applied to such a mesh, there will be no significant change in the decay distance or distribution of the leakage field. This is because the gaps between some of the wires are small compared to the distance between mesh 320 and sample 310. No significant changes in the decay distance exist, whether the mesh's wires are electrically and physically connected, or if there is spacing between mesh's wires, as a result of spacers 570–600, provided this spacing is much smaller than the distance between mesh 320 and sample 310.

Magnetic Shielding

The above discussion covers shielding the sample from an electric field. However shielding the sample from magnetic fields or electromagnetic fields can be done with the same effectiveness by using a mesh made from ferromagnetic materials.

A magnetic field H has a continuous component Hv which is normal to the ferromagnetic surface created by the mesh wires. The magnetic field outside the wire is Hv and inside the wire is bv=m×Hv (where m is the magnetic permeability). Ferromagnetic materials are characterized by having an m>>1, forcing the magnetic field component Hv to approach zero on the boundary between the ferromagnetic mesh's wires and the surrounding space.

When Hv=0, the magnetic field lines will approach the mesh's wires in a direction that is tangent to their surface. The magnitude of magnetic field flux F inside a material is inversely proportional to its magnetic resistance. Ferromagnetic materials have a magnetic resistance value that is m times lower than the magnetic resistance of their surrounding. Thus most of the flux of the magnetic field passes through the ferromagnetic mesh, resulting in the bending of the lines of the magnetic field into those wires. The magnetic field lines are bent in such a way that only a small fraction of the field penetrates the space between the wires. The amount of leakage field that penetrates the ferromagnetic mesh decays rapidly; the decay is shorter than the distance between sample 310 and the mesh. The effect of shielding the sample from the leakage field is achieved, resulting in a fixed working distance.

FIG. 3—INTEGRATING CONDUCTIVE MESH WITHIN SEM SYSTEM—FIRST PREFERRED EMBODIMENT

The lower part of the electron microscope is illustrated in FIG. 3. A pole piece 600 is located at the lower part of the electron microscope and is the only part of it shown. A shielding mesh 610, similar to mesh 320 illustrated and described supra (FIG. 2), is shown. Shielding mesh 610 is placed above the measured sample 620 and is supported at that position by conductive tubes 630 and 640. These tubes are a part of an optical auto-focus system, and are joined to the pole piece by bars 650 and 660. Mesh 610 is made of wires shaped in concentric circles wires and straight wires projecting radically outward. This structure gives mesh 610 a nearly radial symmetry, which is required to avoid astigmatism of the electron beam (not shown). The electron beam emerges through an exit (not shown) in the pole-piece and is focused to a point on sample 620 through a centered exit 670 in mesh 610. The space between the mesh's wires 610 and its distance from sample 620 assures:

(a) an optimal WD which does not depend on the composition of the sample, and (b) a high efficiency in detection of emitted electrons.

The optimal working distance is achieved by shielding sample 620 and allowing only a negligible field intensity to reach the samples surface (similar to field 325 in FIG. 2). Detection of emitted electrons from sample 620 is done by an MCP (multi-channel plate) detector 680 or other detectors, such as ETDs on the side of the SEM (not shown). The efficiency of detection of electrons is as great as though the mesh were not physically present in the trajectory of the emitted electrons as they travel toward the detector. The diameter of mesh 610 is sufficiently large to screen the leakage field. The required diameter is a function of the leakage field's intensity and distribution. The leakage field's intensity and distribution are a function of the intensity of the original fields inside the column. They are also a function of the distance of the inner fields from the beam's exit (not shown), located at the bottom of polepiece 600 and the exit's (aperture's) dimensions.

Tubes 630 and 640 are part of an optical autofocus system similar to that described in the above Shahar et al. patent. Tubes 630 and 640 are made of conductive material, or of a non-conductive or partially conductive material coated by conductive material. The inner diameter of the tubes is typically 3 mm. Tubes 630 and 640 are designed to assure proper functioning of the autofocus feature and still allow proper shielding of the sample by mesh 610. The autofocus optical beam (with central axis 690) passes along the axis of tube 630 toward lens 700, and is focused by the lens into a small spot 710 on sample 620.

Beam 690 exits tube 630 through a small opening 720, located at the end of tube 630 which has a conical shape. The conical shape at the ends of tubes 630 and 640 results from the requirement for reduction the tube's size in the region where the intensity of leakage field and emitted electron flux are at their maximum values. This reduction of the tubes' size minimizes interference with electrons emitted from sample 620 and maintains a high collection efficiency by the detectors. The tubes' size reduction also minimizes any affect on the leakage field and the field produced by the ETDs and prevents astigmatic distortion.

Opening 720, located at the edge of tube 630 is small, typically 50 microns in diameter, and is aligned with one of the spaces between wires of mesh 610. Therefore an optical beam 690 can propagate and be focused at spot 710 on sample 620 with no interference from mesh 610. The incoming collimated optical beam traveling along axis 690 is focused by lens 700 and strikes the sample at point 710 (the beam focal point). From there it is reflected from the surface of sample 620 as a reflected light beam along axis 730. The reflected beam enters tube 640 through hole 740 aligned with one of the spaces between wires of mesh 610.

The dimensions of tube 640 and hole 740 are typically the same as those of tube 630 and hole 720. Alignment is necessary to eliminate collection of light scattered from mesh 610 into tube 640. Such scattered light can affect the measurement's accuracy of the optical autofocusing. When the sample is located at an optimal working distance, light at the focus of lens 750 enters tube 640 through hole 740 and propagates along the axis of tube 640.

For optimal focusing of beam 690 by lens 700 and high collection efficiency of beam 730 by lens 750, both lenses must have a relatively large numerical aperture. A relatively large numerical aperture can be achieved by mounting the lenses close to opening 720 and 740 while keeping their size small. Typical numerical aperture and focal length are 0.1 and 20 mm, respectively. Lenses 700 and 750 are located in close proximity, approximately 20 mm from the sample where emitted electrons are present.

Optical lenses are typically made of insulating materials which may be charged by electrons emitted from sample 620. Charging of lenses 700 and 750 can produce electrical fields which disturb the electron beam propagation, causing improper SEM operation. Lenses 700 and 750 must therefore be coated with a thin conductive layer, which still allows light to pass but prevents them from being charged. This conductive layer is in contact with the tube housing the lens. Thus it is at the same potential as the tube. In spite of their small size (especially at their conical-shaped ends), tubes 630 and 640 may still break the symmetry of the leakage fields, the field produced by the ETD's, and the rotational symmetry of the detectors. This absence of symmetry introduces astigmatic distortion and thus inaccuracy to the system measurement. This disturbance must be corrected in order to maintain rotational symmetry.

FIG. 4—SEM SYSTEMS WITH RADIAL TOP VIEW SYMMETRY—SECOND PREFERRED EMBODIMENT

FIG. 4 is a top cross-sectional view of a SEM system with a structure similar to that of FIG. 3. This configuration maintains rotational symmetry and avoids creating astigmatism of the electron beam. The cross-sectional plane is parallel to the surface of the measured sample, and is located beneath the polepiece (600 of FIG. 3).

FIG. 4 shows tubes 800, 810, 820, and 830 which have a similar construction as tubes 630 and 640 of FIG. 3. Tubes 800, 810, 820, and 830 are joined to the polepiece of the SEM (not shown) by bars 840, 850, 860, and 870. Screening mesh 880 is placed above measured sample 890 and is attached to tubes 800–830 (not shown). The holes (not shown) in the conelike shape at the edge of the tubes are aligned with the space between the wires of mesh 880, as described supra.

Mesh 880 has an exit 900 at the center, typically 100 microns in diameter, where the electron beam passes through toward sample 890. Emitted electrons from sample 890 travel toward ETDs 910–940. By proper alignment and spacing of the detectors, emitted electrons can be forced to travel through spaces between the wires of mesh 880, along the space between tubes 800–830. These electrons suffer only a very small disturbance, such as scattering and absorption caused by mesh 880 and tubes 800–830.

The system of FIG. 4 contains four tubes arranged in two pairs that are disposed symmetrically about hole 900 in mesh 880. This structure has the advantage of being closer to rotational symmetry than the system of FIG. 3, which has only one pair of tubes. This symmetry with its four tubes causes less astigmatism than the system of FIG. 3. Only two tubes (one opposing pair) out of the four tubes are used as a part of the autofocus system, e.g., tubes 810 and 830. The other pair, such as tubes 800 and 820, may have no optical use and are placed only for improving the system radial symmetry and for improving the stability of the mounting of mesh 880.

Tubes 800–830 can be electrically biased by insulating them from the polepiece and applying a certain voltage on them at electrodes 950–980, which are connected to tubes 800–830 respectively. Voltage applied to the electrodes causes an increase of the efficiency of detectors 910–940 in collecting emitted electrons from sample 890. The value and polarity of those voltages are selected to increase the detectors' efficiency and do not significantly influence the high-energy electrons in the SEM's beam.

Summary, Ramifications, and Scope

We have described a method and apparatus which provide shielding of the sample region in a SEM. An optimal WD is maintained, independent of the measured sample composition or configuration. The optimal WD is precisely determined through the use of an optical autofocus system. The combination of these advantages makes it possible to examine objects quickly and with high resolution.

The above-described implementations of the present system are not the only ones possible. Magnetic fields can be employed instead of or in addition to electric fields, for example. Adjustable electric and magnetic field gradients can be incorporated in conjunction with the mesh to maximize collection efficiency of the microscope's detectors, while minimizing distortion of the scanned image. The dimensions, materials, and shapes of the components can be varied in various manners well known to those skilled in the art. Although the description of the method and apparatus relates to the field of electron microscopy, the same method and apparatus can be used in other technologies where shielding a measured sample from a stray field is required for improvement of measurement accuracy.

Therefore, the scope of this invention should be determined not by the examples given, but by the appended claims and their equivalents.

We claim:

1. A scanning system comprising:
   (a) means for producing a scanning electron beam and scanning a measured sample of a substance with said beam along a scanning range,
   (b) focusing means having a depth of focus and a focal plane remote from said focusing means at a focal length distant from said focusing means,
   (c) said focusing means being arranged to produce a focused electron beam and focus said electron beam onto a focusing spot on said focal plane such that said focal plane coincides with a surface of said sample within an accuracy range equal to said depth of focus throughout said scanning range of said scanning electron beam,
   (d) sensor means for detecting an emission selected from the group consisting of X-rays emitted from said sample, electrons emitted from said sample, and electrons reflected from said sample,
   (e) said sensor means being arranged to provide a sensor output in response to said detecting, (f) said sensor means being positioned in structural symmetry relative to said scanning electron beam for reducing astigmatic distortion of said scanning electron beam, (g) shielding device means mounted above said sample for screening a field selected from the group consisting of magnetic fields from said sample, electromagnetic fields from said sample, and electric fields from said sample, such that said focusing spot and said focal length are independent of any composition or geometry of said sample, (h) said shielding device means having a first opening for allowing passage of said scanning electron beam through said shielding device means throughout said scanning range without disturbance, (i) said shielding device means having a plurality of additional openings for allowing emissions from said sample to strike said sensor means, such that emissions propagating from said sample at multiple orientations will include emissions which travel along trajectories passing through said shielding device, and will also include emissions that pass above said shielding device means and are unscreened, and (j) analyzing means for analyzing the output of said sensor means.

2. The scanning system of claim 1 wherein said means for producing a scanning electron beam is an electron microscope.

3. The scanning system of claim 1 wherein said means for producing said scanning electron beam is an electrostatic lens having a predetermined and adjustable focal length for focusing said electron beam.

4. The scanning system of claim 1 wherein said means for producing said scanning electron beam is a magnetic lens having a predetermined and adjustable focal length for focusing said electron beam.

5. The scanning system of claim 1 wherein said means for producing said scanning electron beam is an electromagnetic lens having a predetermined and adjustable focal length for focusing said electron beam.

6. The scanning system of claim 1, further including means for applying an electric field to said shielding device.

7. The scanning system of claim 1 wherein said means for applying is also arranged to provide a gradient of electric potential to said shielding device.

8. The scanning system of claim 1 wherein said shielding device means comprises a material selected from the group consisting of conductive and ferromagnetic materials.

9. The scanning system of claim 1 wherein said shielding device has structural symmetry relative to said electron beam for reducing astigmatic distortion of said scanning electron beam.

10. The scanning system of claim 1 wherein said shielding device has a structure which allows at least one optical beam to propagate from said sample and through said shielding device.

11. The scanning system of claim 10 wherein said shielding device also includes a plurality of tubes selected from among the group consisting of conductive and ferromagnetic materials.

12. The scanning system of claim 11 wherein said tubes are positioned symmetrically about said electron beam for reducing astigmatic distortion of said scanning electron beware.

13. The scanning system of claim 10 wherein said tubes are selected from the group consisting of tubes which direct light to said sample, tubes which collect light from said sample, tubes which do not direct light to said sample, and tubes which do not collect light from said sample.

14. The scanning system of claim 13 wherein said tubes also include at least one lens.

15. The scanning system of claim 14 wherein said lens is coated with a thin layer of material which allows said light to pass therethrough.

16. The scanning system of claim 15 wherein said material is conductive.

17. The scanning system of claim 1 wherein said scanning system further includes means for adjusting the position of said sample up or down along said electron beam.

18. The scanning system of claim 1, further including an optical system for measuring the position of the surface of said sample.

19. The scanning system of claim 1, further including:

(a) optical system measuring means for measuring the position of the surface of said sample, and (b) adjusting means for adjusting said focusing means according to said measuring.

20. The scanning system of claim 1, further including:

(a) moving means for moving said sample, (b) optical system measuring means for measuring the position of the surface of said sample, and (c) adjusting means for adjusting the position of said sample according to said measuring.

21. A method of scanning, comprising:

(a) producing a scanning electron beam and scanning a measured sample of a substance with said beam along a scanning range, (b) providing focusing means having a depth of focus and a focal plane remote from said focusing means at a focal length distance from said focusing means, (c) causing said focusing means to produce a focused electron beam and focusing said electron beam onto a focusing spot on said focal plane such that said focal plane coincides with a surface of said sample within an accuracy range equal to said depth of focus throughout said scanning range of said scanning electron beam, (d) providing sensor means for detecting an emission selected from the group consisting of X-rays emitted from said sample, electrons emitted from said sample, and electrons reflected from said sample, (e) using said sensor means for detecting an emission from said sample and provide a sensor output in response to said detecting, (f) positioning said sensor means in structural symmetry relative to said scanning electron beam for reducing astigmatic distortion of said scanning electron beam, (g) screening a field selected from the group consisting of magnetic fields from said sample, electromagnetic fields from said sample, and electric fields from said sample by positioning shielding device means above said 'sample such that said focusing spot and said focal length are independent of any composition or geometry of said sample, (h) said shielding device means having a first opening for allowing passage of said scanning electron beam through said shielding device means .throughout said scanning range without disturbance, (i) said shielding device means having a plurality of additional openings for allowing emissions from said sample to strike said sensor means, such that emissions propagating from said sample at multiple orientations will include emissions which travel along trajectories passing through said shielding device, and will also include a part of said emissions that passes above said shielding device means and is unscreened, and (j) analyzing the output of said sensor means.

22. The method of claim 21 wherein said scanning is done by a scanning electron microscope.

23. The method of claim 21 wherein said focused beam is focused by an electrostatic lens having a predetermined and adjustable focal length.

24. The method of claim 21 wherein said focused beam is focused by a magnetic lens having a predetermined and adjustable focal length.

25. The method of claim 21 wherein said focused beam is focused by an electromagnetic lens having a predetermined and adjustable focal length.

26. The method of claim 21, further including applying a plurality of electric potentials to said shielding device to improve collection efficiency of emitted electrons.

27. The method of claim 26 wherein said applied electric potentials have a gradient.

28. The method of claim 21 wherein shielding device means comprises a material selected from the group consisting of conductive materials and ferromagnetic materials for providing said screening.

29. The method of claim 21 wherein said shielding device means has structural symmetry relative to said electron beam for reducing astigmatic distortion of said scanning electron beam.

30. The method of claim 21 wherein said shielding device means is arranged to allow at least one optical beam to propagate therethrough.

31. The method of claim 30 wherein said shielding device means comprises a plurality of tubes made of at least one material selected from the group consisting of conductive and ferromagnetic materials.

32. The method of claim 30 wherein said shielding device means comprises a plurality of tubes selected from the group consisting of tubes which direct light to said sample and tubes which collect light from said sample.

33. The method of claim 32 wherein said tubes comprise at least one lens selected from the group consisting of lenses which direct light to said sample and lenses which collect light from said sample.

34. The method of claim 32 wherein said tubes have a symmetry relative to said electron beam for reducing astigmatic distortion of said scanning electron beam.

35. The method of claim 21, further including adjusting the position of said sample vertically along said electron beam.

36. The method of claim 21, further including optically measuring the position of the surface of said sample.

37. The method of claim 21, further including:

(a) optically measuring the position of the surface of said sample, and (b) adjusting said focus of said electron beam according to said measuring.

38. The method of claim 21, further including:

(a) moving said sample beneath said scanning electron beam, (b) optically measuring the position of the surface of said sample, and (c) adjusting the position of said sample according to said measuring.

39. A method of scanning in a scanning electron microscope, comprising:

(a) providing a scanning electron microscope, (b) providing, in said scanning electron microscope, a scanning electron beam and scanning a measured sample of a substance with said beam along a scanning range, (c) providing, in said scanning electron microscope, focusing means having a depth of focus and a focal plane remote from said focusing means at a focal length distance from said focusing means, (d) causing said focusing means to produce a focused electron beam and focusing said electron beam onto a focusing spot on said focal plane such that said focal plane coincides with a surface of said sample within an accuracy range equal to said depth of focus throughout said scanning range of said scanning electron beam, (e) providing, in said scanning electron microscope, sensor means for detecting an emission selected from the group consisting of X-rays emitted from said sample, electrons emitted from said sample, and electrons reflected from said sample, (f) using said sensor means for detecting an emission from said sample and provide a sensor output in response to said detecting, (g) positioning said sensor means in structural symmetry relative to said scanning electron beam for reducing astigmatic distortion of said scanning electron beam, (h) screening a field selected from the group consisting of magnetic fields from said sample, electromagnetic fields from said sample, and electric fields from said sample by positioning shielding device means comprising a mesh structure above said sample such that said focusing spot and said focal length are independent of any composition or geometry of said sample, (i) said shielding device means having a first opening for allowing passage of said scanning electron beam through said shielding device means without disturbances throughout said scanning range, (j) said shielding device means having a plurality of additional openings for allowing emissions from said sample to strike said sensor means, such that emissions propagating from said sample at multiple orientations will include emissions which travel along trajectories passing through said shielding device, and will also include a part of said emissions that passes above said shielding device means and is unscreened, and (k) analyzing the output of said sensor means.

40. The scanning system of claim 39, further including an optical autofocus system positioned beneath said microscope and above said mesh structure.

41. The scanning system of claim 40, further including a plurality of tubes symmetrically disposed about the axis of a column of said microscope to eliminate astigmatic distortion in said scanning.

42. The scanning system of claim 40, further including a plurality of mounting members for said tubes, said mounting members selected from the group consisting of insulating and semi-insulating materials, said mounting members being attached to a column of said microscope.

43. The scanning system of claim 40, further including means for applying a plurality of voltaic potentials to said tubes.

44. The scanning system of claim 40, further including a plurality of tubes selected from the group consisting of tubes comprising conductive and ferromagnetic materials, said tubes being mounted on a column of said microscope.

45. The scanning system of claim 40, further including a plurality of tubes selected from the group consisting of tubes comprising tubes which direct light toward said sample, tubes which collect light from said sample, tubes which do not direct light to said sample, and tubes which do not collect light from said sample, said tubes being mounted on the column of said microscope with axes at an acute angle with respect to said sample so that the axes of said tubes intersect at a point on said sample.

46. The scanning system of claim 45, further including at least one lens within said tube.

47. The scanning system of claim 46, further including a light-transmissive coating on said lens.

48. The scanning system of claim 47 wherein said coating is a conductive material.

49. The scanning system of claim 39 wherein said shielding mesh structure comprises a plurality of materials selected from the group consisting of conductive and ferromagnetic materials.

50. The scanning system of claim 39, further including applying an electric potential to said shielding mesh structure.

51. The scanning system of claim 50 wherein said applied electric potential has a gradient.

* * * * *

UNITED STATES PATENT AND TRADEMARK OFFICE
CERTIFICATE OF CORRECTION

PATENT NO. : 5,591,971
DATED : January 7, 1997
INVENTOR(S) : A. SHAHAR et al.

It is certified that error appears in the above-identified patent and that said Letters Patent is hereby corrected as shown below:

Col. 7, line 6, change "toque" to — an unique

Claim 21, clause (g), line 5, change "said 'sample" to —said sample—.

Claim 21, clause (h), line 3, change "means .throughout" to —means throughout—.

Signed and Sealed this

First Day of September, 1998

*Attest:*

BRUCE LEHMAN

*Attesting Officer*  *Commissioner of Patents and Trademarks*